United States Patent [19]
Kohama

[11] Patent Number: 5,717,356
[45] Date of Patent: Feb. 10, 1998

[54] LOW INSERTION LOSS SWITCH

[75] Inventor: Kazumasa Kohama, Kanagawa, Japan

[73] Assignee: Sony Corporation, Tokyo, Japan

[21] Appl. No.: 590,172

[22] Filed: Jan. 23, 1996

[30] Foreign Application Priority Data

Jan. 23, 1995 [JP] Japan ................... 7-027308

[51] Int. Cl.$^6$ ............................................. H03K 17/687
[52] U.S. Cl. ...................... 327/427; 327/365; 333/81 R
[58] Field of Search .................................. 327/308, 365, 327/374, 425, 427, 430; 333/81 A, 81 R, 101, 103, 104, 262

[56] References Cited

U.S. PATENT DOCUMENTS

| | | | |
|---|---|---|---|
| 4,575,642 | 3/1986 | Hochreutiner et al. | 307/200 |
| 4,918,401 | 4/1990 | Langer | 333/81 R |
| 4,983,865 | 1/1991 | Ho et al. | 327/427 |
| 4,996,504 | 2/1991 | Huber et al. | 333/81 R |
| 5,087,899 | 2/1992 | Lauper | 333/81 R |
| 5,148,048 | 9/1992 | Kawasaki et al. | 307/263 |
| 5,281,928 | 1/1994 | Ravid et al. | 333/81 R |
| 5,448,207 | 9/1995 | Kohama | 333/81 R |
| 5,510,747 | 4/1996 | Williams | 327/365 |
| 5,548,239 | 8/1996 | Kohama | 333/103 |
| 5,563,557 | 10/1996 | Sasaki | 333/81 R |

FOREIGN PATENT DOCUMENTS

| | | |
|---|---|---|
| 0 409 374 A2 | 1/1991 | European Pat. Off. |
| 0 434 898 A2 | 7/1991 | European Pat. Off. |
| 0 568 279 A1 | 11/1993 | European Pat. Off. |
| 2 157 521 | 10/1985 | United Kingdom. |
| WO 91/15055 | 10/1991 | WIPO. |

OTHER PUBLICATIONS

Patent Abstracts of Japan, vol. 12, No. 196 (E–618), Jun. 7, 1988, JP 62 296617 A (Matsushita Electric Works Ltd.), Dec. 23, 1987.

Patent Abstracts of Japan, vol. 11, No. 187 (E–516), Jun. 16, 1987, JP 62 015924 A (Matsushita Electric Works Ltd.), Jan. 24, 1987.

Patent Abstracts of Japan, vol. 18, No. 174 (E–1530), Mar. 24, 1994, JP 05 343972 A (Matsushita Electric Works Ltd.), Dec. 24, 1993.

Patent Abstracts of Japan, vol. 9, No. 212 (E9339), Aug. 29, 1985, JP 60 074718, (Hitachi Seisakusho KK), Apr. 27, 1995.

*Primary Examiner*—Timothy P. Callahan
*Assistant Examiner*—Jeffrey Zweizig
*Attorney, Agent, or Firm*—Hill, Steadman & Simpson

[57] ABSTRACT

A switching circuit further decreasing the insertion loss. The first capacitor is connected between the drain terminal of the field effect transistor and the ground and/or the second capacitor is connected between the source terminal of the field effect transistor and the ground, and the capacitances of the first and/or second capacitors are set to optimum values. Accordingly, the switching circuit can be easily obtained which is low in insertion loss at a desired frequency. Besides, since a bias circuit for generating bias voltage from control voltage which is applied to the two control terminals of a switching circuit using a field effect transistor is provided, a switching circuit which does not need exclusive bias terminals and is superior in isolation property can be realized.

12 Claims, 5 Drawing Sheets

LOW INSERTION LOSS SWITCH

BACKGROUND OF THE INVENTION

1. Field of the Invention

The present invention relates generally to a switching circuit and a composite switching circuit, and more particularly, the present invention relates to a switching circuit and a composite switching circuit for switching the input/output of a high frequency signal.

2. Description of the Related Art

At present, mobile communication systems such as mobile telephones, portable telephones, or the like have been developed for use on a large scale. On the other hand the, shortage of communication lines is becoming a more and more serious problem in urban areas, and various mobile communication systems have been put into practical use in various countries. In many cases, not analog communication systems but digital communication systems have been adopted as these mobile communication systems. Further, in such mobile communication systems, a submicrowave band which is at a higher frequency than the communication frequency band of current mobile communication systems is used as the communication frequency band.

In such a communication system which transmits and receives signals of a submicrowave band, semiconductor field-effect transistors (FETs) are often used in the signal processing portion of a portable terminal. Particularly, in the case of a portable terminal in which portability is regarded as important, it is also important to develop a monolithic microwave IC (hereinafter referred to as MMIC) using a GaAs FET which makes it possible to make the portable terminal physically small in size, low in driving voltage and low in power consumption. Particularly, a high-frequency switch for switching a high-frequency signal in a portable terminal is one of key devices.

Operation of a FET will be explained in the case where the FET is used as a switching device. In the case of using the FET in an ON state, a bias voltage sufficiently higher than the pinch-off voltage of the FET is applied to the gate of the FET. In contrast, in the case of using the FET in an OFF state, a bias voltage sufficiently lower than the pinch-off voltage of the FET is applied to the gate of the FET. In this state, when a bias voltage sufficiently higher than the pinch-off voltage of the FET is applied to the gate of the FET, the impedance between the source and the drain of the FET can be made low, so that the FET can be turned on. Further, in this state, when a bias voltage sufficiently lower than the pinch-off voltage of the FET is applied to the gate of the FET, the impedance between the source and the drain of the FET can be made high, so that the FET can be turned off.

In the case of a GaAs FET commercially available at present, the FET can be approximated to a resistance component connected between the drain and the source thereof when the FET is in an ON state, while the FET can be approximated as a capacitive component connected between the drain and the source thereof when the FET is in an OFF state. In this case, the resistance and the capacitance of the FET can be made several [Ω/mm] and several hundred [fF/mm] per unit gate width (Wg) of the FET, respectively. The resistance Ron and the capacitance Coff are 2 [Ω/mm] and 300 [fF/mm], for example, respectively.

In the case of a FET as described above, when a FET having a gate width Wg of about 1 [mm] is used, the loss of the FET in an ON state is considered to be suppressed to a small value of about 0.2 [dB] at the time of dealing with a signal of several [GHz] or less.

However, when the aforesaid FET switch is used in a portable telephone terminal or the like, a switch IC using the FET or the FET switch is often mounted in a cheap package such as a plastic mold package etc. in order to lower the cost thereof.

Such a plastic mold package influences the insertion loss to a significant degree when the signal frequency is in the submicrowave band or higher.

In particular, when bonding wires or the like formed of gold or the like are used to connect between a semiconductor chip and signal pins of the package, there arises a problem that the inductance of the bonding wires greatly influences the insertion loss of the switch. In fact, this loss is a reflection loss due to impedance mismatching.

For example, when an inductance of 2 [nH] due to the bonding wires or the like is added to each of the input and output terminals of a FET having a gate width Wg of 1 [mm] and a resistance Ron of 2 [Ω], the insertion loss increases from 0.2 [dB] to 1.1 [dB] at a frequency of 2 [GHz], for example, as shown by the dotted line in FIG. 6. Thus, it is necessary to decrease the inductance of the bonding wires or the like in order to lower the insertion loss of the switch IC.

Further, since the mold package limits the freedom in the mounting conditions thereof, it is not easy to decrease the inductance. The inductance may be decreased to some extent when many bonding wires are used in parallel to connect the signal terminals between the semiconductor chip and the package. However, this method may not be preferable since there is such a large defect that the chip area becomes larger.

As a method of avoiding such problems, there is a proposal to decrease the loss due to the bonding wire by using a resonance phenomenon caused by an inductance of the bonding wire and a parasitic capacitance existing between a signal path and the ground.

In this case, however, each of the parasitic capacitance and the parasitic inductance of the bonding wire is a subsidiary parameter and hence is not a parameter which is capable of being controlled easily. For example, it has been considered to control the parasitic capacitance by adjusting a gate width of the FET formed on an IC chip. However, at the time of employing such a control method, the suitable configuration of the switching circuit may not necessarily be formed and consequently the insertion loss may be raised or the isolation property may be deteriorated.

In this manner, there was a problem in that it is very difficult to set the inductance of the bonding wires and the parasitic capacitance suitably so as to decrease the insertion loss.

As described above, at the time of employing an FET as a switch, it is necessary to apply the ON bias voltage which is sufficiently larger than the pinch-off voltage and capable of making the ON resistance sufficiently small and to apply the OFF bias voltage capable of completely turning off the FET to the gate terminal of the FET. In most cases, since the pinch-off voltage Vp is set to be 0 [V] or less, a negative voltage is required as the off bias voltage generally. However, since a DC-DC converter or the like is required for a negative power source, it is not preferable to use the negative power source in view of cost, size and power consumption.

In order to avoid such a problem due to the negative power source, it is preferable to operate the switch circuit only by a positive power source. In fact, a relative voltage of the gate with respect to the source and the drain can be made negative even when a positive bias voltage ($V_{bias}$) is applied to the drain and the source terminals of the FET and a voltage of 0 [V] or more (in general, 0 [V]) is applied to the gate of the FET. In this case, the FET can be controlled in an OFF state (pinch-off state).

In this case, however, there is a problem in that a bias terminal for applying a bias voltage ($V_{bias}$) is additionally required. Further, the wiring of a bias line extending from the bias ($V_{bias}$) terminal may result in the increase of the occupying area of the switching circuit and further increase the semiconductor chip size of the IC and the IC package size. Furthermore, the bias terminal causes deterioration of the isolation properties or the like.

In addition, at the time of applying the bias voltage ($V_{bias}$), the bias voltage ($V_{bias}$) is required to be set lower than the ON bias voltage of the gate by almost the built-in voltage $V_{bi}$ in order to obtain a sufficiently low ON resistance. For this purpose, the bias voltage ($V_{bias}$) is required to be changed in accordance with the control voltage (ON bias) of the FET. However, such a changing operation is troublesome for a user using a switching IC for controlling a positive power source or the like.

SUMMARY OF THE INVENTION

In view of the foregoing, an object of the present invention is to provide a switching circuit which has lower insertion loss for a high-frequency signal as compared with conventional switching circuits. Further, the present invention provides a switching circuit driven by a positive power source which is capable of realizing high isolation properties and a composite switching circuit using such switching circuits.

The foregoing object and other objects of the present invention have been achieved by the provision of a switching circuit according to the present invention which includes: a field effect transistor having a signal path formed between a drain and a source thereof; a high-impedance element connected to a gate terminal of the field effect transistor; and a first capacitor connected between the drain terminal of the field effect transistor and a ground or a second capacitor connected between the source terminal of the field effect transistor and the ground.

A switching circuit according to the present invention includes: a bias voltage generating means, having first and second control terminals to which first and second voltages having different values are alternately applied, for generating a bias voltage on the basis of the first and second voltages applied to the first and second control terminals; a field effect transistor having a signal path formed between a drain and a source thereof; and a high-impedance element connected between a gate terminal of the field effect transistor and the first control terminal.

Further, a composite switching circuit according to the present invention is formed by combining a plurality of the aforesaid switching circuits.

The matching characteristic determined by parasitic inductances existing on the signal path is adjusted by varying the capacitances of the first capacitor which is connected between the drain terminal of the field effect transistor and the ground and/or the second capacitor which is connected between the source terminal of the field effect transistor and the ground. Accordingly, the insertion loss can be further decreased at a desired frequency.

Since the bias voltage is generated on the basis of the two kinds of voltages applied to the first and second control terminals, a terminal dedicated for biasing can be eliminated even when a positive power source is employed. Thus, the package and the chip can be further miniaturized by a space corresponding to the bias dedicated terminal. Further, the leakage of the signal through a bias line can be eliminated with the elimination of the bias dedicated line to thereby improve the isolation property.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of the present invention will be described with reference to the accompanying drawings:

(1) Basic Configuration

Figure 1:
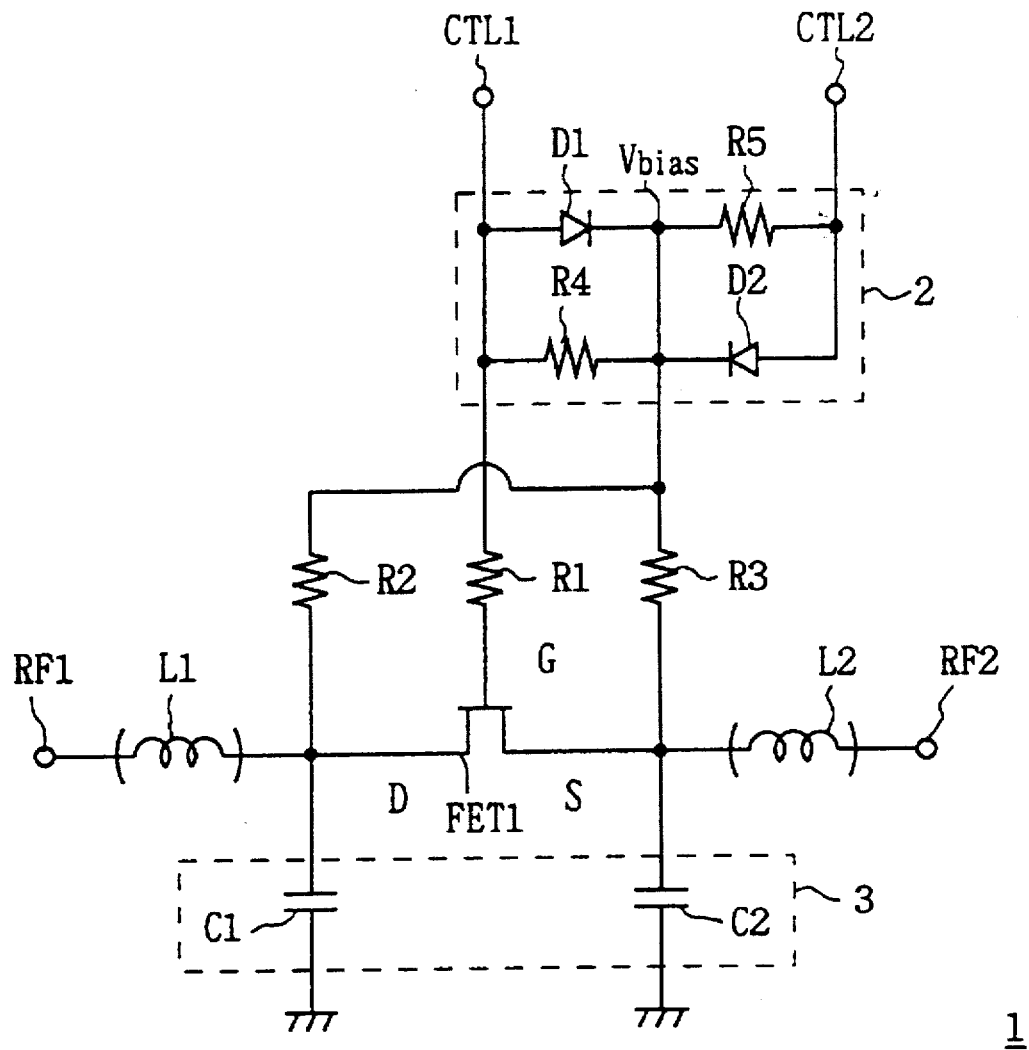
FIG. 1 is a connection diagram showing an embodiment of a switching circuit according to the present invention.

FIG. 1 shows a basic configuration of a switching circuit 1. The switching circuit 1 is characterized by including a bias voltage generating portion 2 for generating a bias voltage on the basis of two kinds of voltages applied to two control terminals CTL1 and CTL2 and a matching circuit portion 3 formed by capacitors C1 and C2 each arranged to ground a signal path therethrough.

The explanation will be made at first as to the biasing circuit portion 2, then the explanation will be made as to the matching circuit portion 3.

(2) Biasing Circuit Portion

The biasing circuit portion 2 is formed by diodes D1, D2 and resistors R4, R5 connected between the two control terminals CTL1, CTL2. The control terminals CTL1 and CTL2 are supplied with two kinds of voltages V (high) and V (low) (V (high)>V (low)) alternately such that, for example, that the control terminal CTL2 is supplied with the voltage of 0 [V] (3[V]) when the control terminal CTL1 is supplied with the voltage of 3 [V] (0 [V]), respectively.

Supposing that the voltage $V_{CTL1}$ of the control terminal CTL1 is higher than the voltage $V_{CTL2}$ of the control terminal CTL2 (that is, $V_{CTL1} > V_{CTL2}$), the operation of the biasing circuit portion 2 will be explained at the time of generating the bias voltage therefrom. In this case, the diode D1 is forward-biased and the diode D2 is reverse-biased. As a consequence, the diode D1 is placed in a state of a low impedance Zd (Low) and the diode D2 is placed in a state of a high impedance Zd (High).

Figure 2:
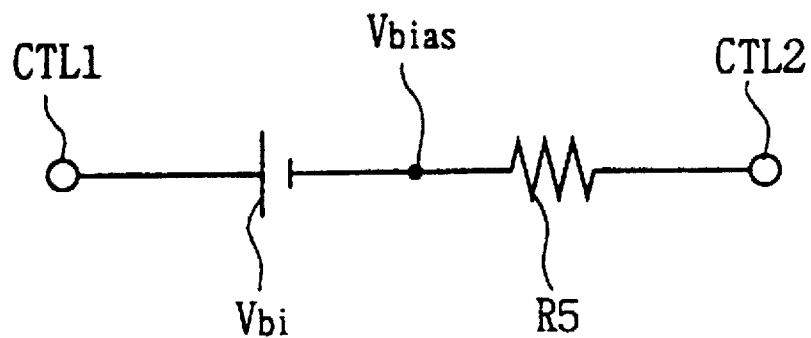
FIG. 2 is a connection diagram showing an equivalent circuit of a biasing circuit portion in a state where different voltages are applied to two control terminals thereof.

When the following expression:

$$|Zd\ (Low)| << |R4|, |R5| << |Zd\ (High)| \qquad (1)$$

is satisfied, the equivalent circuit of the biasing circuit portion 2 will be represented as shown in FIG. 2. Thus, a bias terminal $V_{bias}$ corresponding to a connection center point of the diode D1 and the resistor R5 is supplied with a voltage V (High)–$V_{bi}$ which is lower than the voltage V (High) by a junction built-in voltage $V_{bi}$ of the diode.

This fact is the same as a case where the voltage $V_{CTL2}$ of the control terminal CTL2 is higher than the voltage $V_{CTL1}$ of the control terminal CTL1 (that is, $V_{CTL2} > V_{CTL1}$).

The control terminal CTL1 is connected to the gate terminal of a field effect transistor FET1 through a high-impedance resistor R1, and the bias terminal $V_{bias}$ is connected to the drain and source terminals of the FET1 through high-impedance resistors R2 and R3. The gate terminal is DC-biased by the DC voltage $V_{CTL1}$ applied to the control terminal CTL1, and the drain and source terminals are also DC-biased by the voltage V (High)–$V_{bi}$ applied to the bias terminal $V_{bias}$.

As a consequence, the relative voltage of the gate terminal with respect to the drain terminal (source terminal) becomes $V_{bi}$ when $V_{CTL1}$=V (High) and V (Low)–V (High)+$V_{bi}$ when $V_{CTL1}$=V (Low).

In general, the resistance between the drain and the source of the FET tends to saturate when the bias voltage applied to the gate terminal of the FET becomes almost the built-in voltage. Accordingly, it is preferable to set the ON bias voltage applied to the gate terminal of the FET used as a switch to almost the built-in voltage. This is because, even when a voltage not less than the built-in voltage is tried to be applied to the gate terminal, a leak current flows in the gate terminal to cause the voltage drop by the resistor connected to the gate terminal, and hence a voltage not less than built-in voltage is hardly applied to the gate.

Accordingly, even if the FET is controlled by a voluntary control voltage as described above (in this case, however, the voltage difference between V (Low) and V (High) is required to be not less than the built-in voltage), the relative voltage of the gate terminal in an ON state relative to the drain terminal (source terminal) will be the built-in voltage $V_{bi}$ which is optimum for the FET used as a switch.

As described above, since a bias terminal for connecting to an external circuit can be eliminated by providing the biasing circuit portion 2, the package and the chip can be made smaller in size. Further, since a bias line can be eliminated, the leakage of a signal through the bias line can also be eliminated, so that the isolation characteristic of the switching circuit can be improved. Further, the switching circuit 1 can be controlled only by a positive power source. Furthermore, even when the control voltage is changed, the ON bias voltage of the FET used in an IC can be maintained at an optimum value.

(3) Matching Circuit Portion

The matching circuit portion 3 serves to perform impedance matching with a transmission system to realize a decrease in the loss by the capacitors C1, C2 arranged to ground the signal path therethrough and the parasitic inductances L1, L2 on the signal path.

Figure 3:
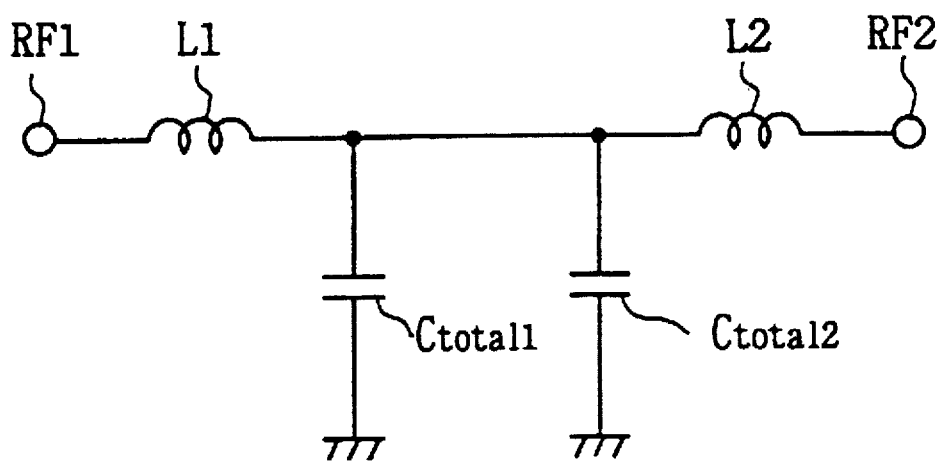
FIG. 3 is a connection diagram showing an equivalent circuit of a signal path in a state where the switching circuit is controlled in an ON state.

FIG. 3 shows an equivalent circuit of the matching circuit portion when the switching circuit is in an ON state. In this figure, parasitic inductances such as bonding wires or the like existing at portions of input and output terminals RF1, RF2 for a high-frequency signal are represented by L1, L2, respectively, and the ON resistance of the FET is supposed to be 0 for simplifying the explanation. A capacitance $C_{total1}$ represents a composite capacitance of the capacitance C1 and a parasitic capacitance C', and a capacitance $C_{total2}$ represents a composite capacitance of the capacitance C2 and a parasitic capacitance C".

In FIG. 3, supposing that a value of each of the parasitic inductances L1 and L2 is L, a value of each of the composite capacitances $C_{total1}$ and $C_{total2}$ is C/2, an angular frequency is ω, and a characteristic impedance of the transmission system is R, an input impedance $Z_{in}$ can be represented by the following expression:

$$Z_{in} + j\omega L + \frac{(j\omega L + R)/j\omega C}{(1/j\omega C + j\omega L + R)} = \frac{j\omega(L - \omega^2 L^2 C + L - CR^2)}{(1 - \omega^2 LC + j\omega CR)} + R \quad (2)$$

Thus, a matching frequency f will be represented by the following expression:

$$f = 1/(2\pi L) \times ((2L - CR^2)/C)^{0.5} \quad (3)$$

When L is 2 [nH] and C is 1 [pF], for example, the matching frequency f will be 3.1 [GHz] from this expression.

Figure 4:
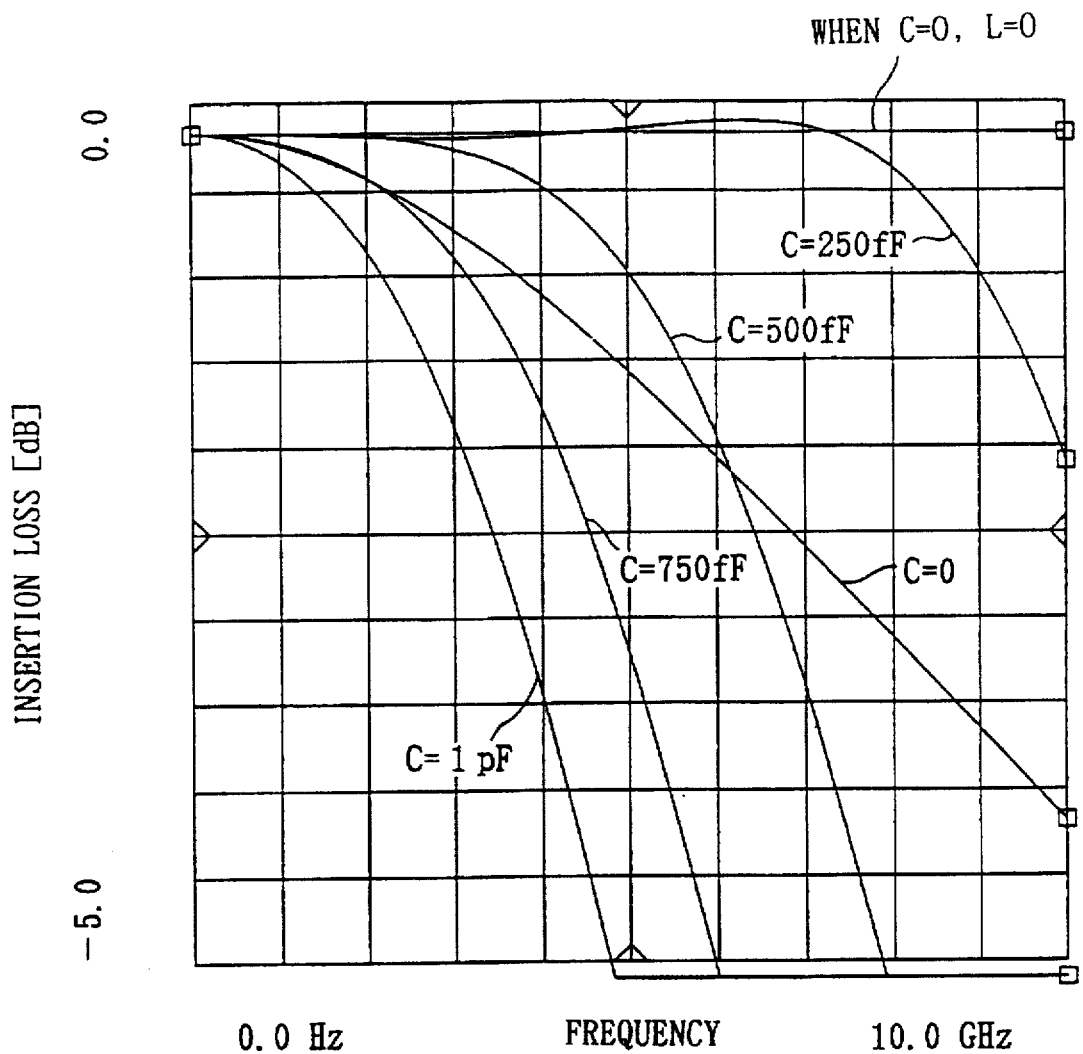
FIG. 4 is a characteristic curvilinear diagram explaining the improvement of the insertion loss by the matching circuit portion.

Then, a simulation result of the frequency characteristic of the insertion loss will be shown in FIG. 4 in the case where the parasitic inductance L of the switching circuit 1 is 1 [nH] and the value C is changed. This simulation result is an example where a GaAs field junction type FET (JFET) having a gate width of 1 [mm] and a gate length 0.5 [μm] is employed as an FET. It will be clear from this figure that there is a frequency range where the insertion loss is smaller than the case of C=0 when C=250 [fF] and 500 [fF]. Accordingly, it will be understood that this effect is due to the matching capacitors.

It will be understood from FIG. 4 and the expression of the matching frequency that the insertion loss can be decreased in the frequency range of several [GHz] even when the matching capacitance is 1 [pF] at most. In this case, the parasitic inductance of the bonding wire or the like is several [nH]. When a metal-insulator-metal (MIM) capacitor using a nitride silicon insulation film formed in the usual GaAs FET fabricating process is used as the matching capacitor, the capacitance of about 1[pF] can be realized by a square capacitor each side being about 100 [μm]. Accordingly, an area of the matching capacitor on a semiconductor chip can be made very small.

Further, since very small capacitance is formed on a chip, the insertion loss can be decreased at a desired frequency.

(4) Other Embodiments

While, in the above-described embodiment, the present invention is applied to the switching circuit 1 having both the biasing circuit portion 2 and the matching circuit portion 3. However, the present invention is not limited thereto but may be applied to the switching circuit having only the matching circuit portion 3.

While, in the above-described embodiments, the high-impedance element is connected to each of the drain and source terminals of the FET1. However, the present invention is not limited thereto but may be applied to a case where a high-impedance element is connected to one of the drain and source terminals.

While, in the above-described embodiments, the capacitor C1 is connected between the drain terminal of the FET1 and the ground and the capacitor C2 is connected between the source terminal of the FET1 and the ground. However, the present invention is not limited thereto but may be applied to a case where only one capacitor is connected between the ground and one of the drain and source terminals of the FET1.

While, in the above-described embodiments, a single gate FET is used as the FET1. However, the present invention is not limited thereto but may be widely applied to a case where a dual gate FET or a multi-gate FET is used as the FET1.

While, in the above-described embodiments, a junction type FET is used as the FET1. However, the present invention is not limited thereto but may be applied to a case where a metal semiconductor junction (MES) FET is used as the FET1.

While, in the above-described embodiments, the present invention is applied to the basic switching circuit 1. However, the present invention is not limited thereto but may be applied to a composite type switching circuit formed by combining a plurality of the switching circuits 1.

Figure 5:
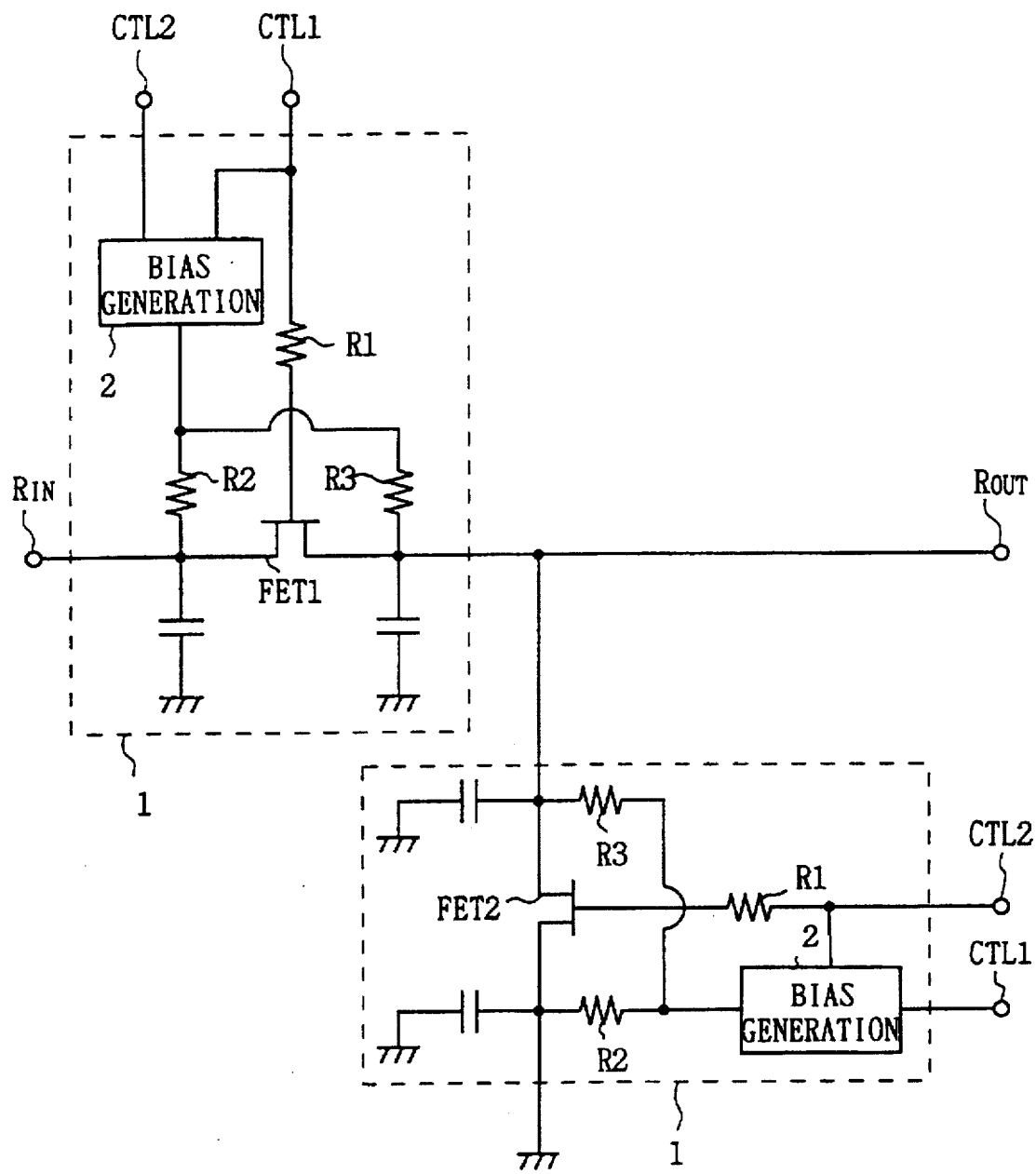
FIG. 5 is a connection diagram explaining a composite switching circuit.
Figure 6:
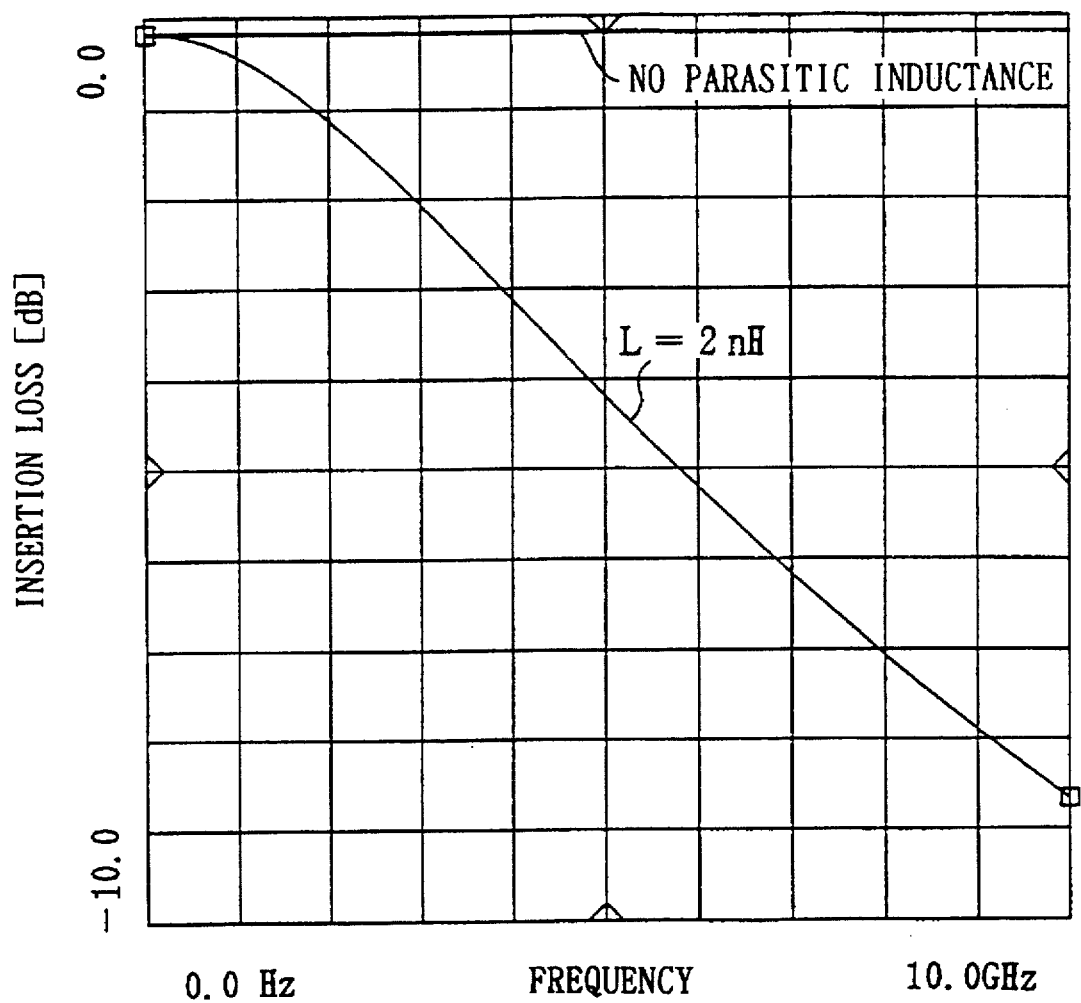
FIG. 6 is a characteristic curvilinear diagram explaining the insertion loss due to a parasitic inductance.

For example, as shown in FIG. 5, the present invention may be applied to a composite type switching circuit in which the switching circuit 1 is arranged in series with a signal path and the other switching circuit 1 is arranged between the signal path and the ground.

As described above, according to the present invention, the first capacitor is connected between the drain terminal of the field effect transistor and the ground and/or the second capacitor is connected between the source terminal of the field effect transistor and the ground, and the capacitances of the first and/or second capacitances are set to optimum values. Accordingly, there can be realized a switching circuit which is low in insertion loss at a desired frequency.

Further, according to the present invention, since the biasing circuit for generating the bias voltage from the control voltage applied to the two control terminals is provided in addition to the switching circuit using the field effect transistor, the switching circuit can be realized which is able to eliminate a dedicated bias terminal even at the case of using a positive power source and is excellent in isolation property.

While there has been described in connection with the preferred embodiments of the invention, it will be obvious to those skilled in the art that various changes and modifications may be made, therefore, to cover in the appended claims all such changes and modifications as fall within the true spirit and scope of the invention.

What is claimed is:

1. A switching circuit comprising:

a field effect transistor having a drain and a source, a path between said drain and said source serving as a signal path;

a high-impedance element having a first terminal connected to a gate terminal of said field effect transistor and second terminal connected to a bias control circuit, said bias control circuit comprised of first and second diodes disposed in a forward direction from corresponding first and second control terminals; and a matching circuit comprising a first capacitor connected between said drain terminal of said field effect transistor and a ground.

2. The switching circuit according to claim 1, wherein said field effect transistor is a multi-gate field effect transistor.

3. The switching circuit according to claim 1, wherein said field effect transistor is a junction type field effect transistor.

4. A switching circuit comprising:

a field effect transistor having a drain and a source, a path between said drain and said source serving as a signal path;

a bias voltage generating means, having first and second control terminals to which first and second voltages having different values are alternately applied, for generating a bias voltage on the basis of said first and second voltages applied to said first and second control terminals, wherein said bias voltage is applied to said field effect transistor; and a high-impedance element connected between a gate terminal of said field effect transistor and said first control terminal.

5. The switching circuit according to claim 4, wherein, said bias voltage generating means includes:

a first diode connected between said first control terminal and an output terminal of said bias voltage generating means in a manner that said first diode is disposed in a forward direction from said first control terminal toward said output terminal;

a first resistor connected in parallel to said first diode between said first control terminal and said output terminal;

a second diode connected between said second control terminal and said output terminal in a manner that said second diode is disposed in a forward direction from said second control terminal toward said output terminal; and a second resistor connected in parallel to said second diode between said second control terminal and said output terminal.

6. The switching circuit according to claim 4, wherein said circuit further includes a second high-impedance element connected between said drain terminal of said field effect transistor and said output terminal of said bias voltage generating means.

7. The switching circuit according to claim 4, wherein said field effect transistor is a multi-gate field effect transistor.

8. The switching circuit according to claim 4, wherein said field effect transistor is a junction type field effect transistor.

9. The switching circuit according to claim 6, wherein said circuit further includes a third high-impedance element connected between said source terminal of said field effect transistor and said output terminal of said bias voltage generating means.

10. The switching circuit according to claim 4, wherein said circuit further includes a second high-impedance element connected between said source terminal of said field effect transistor and said output terminal of said bias voltage generating means.

11. The switching circuit according to claim 4, wherein the first and second voltages are both positive voltages.

12. A switching circuit comprising:

a field effect transistor having a drain and a source, a path between said drain and said source serving as a signal path;

a high-impedance element having a first terminal connected to a gate terminal of said field effect transistor and second terminal connected to a bias control circuit, said bias control circuit comprised of first and second diodes disposed in a forward direction from corresponding first and second control terminals; and a matching circuit comprising a first capacitor connected between said source terminal of said field effect transistor and a ground.

* * * * *